United States Patent [19]
Munson et al.

[11] 3,934,085
[45] Jan. 20, 1976

[54] AUDIO AMPLIFIER SYSTEMS

[75] Inventors: Robert Thomas Munson, St. Clement; Philip Hodgson, St. Martin, both of Jersey, Channel Islands

[73] Assignee: Television Research Limited, St. Helier, Jersey, Channel Islands

[22] Filed: July 29, 1974

[21] Appl. No.: 492,864

Related U.S. Application Data

[63] Continuation-in-part of Ser. No. 455,373, March 27, 1974.

[30] Foreign Application Priority Data

Mar. 28, 1973 United Kingdom............... 14951/73

[52] U.S. Cl. ............................. 179/1 P; 179/1 VL
[51] Int. Cl.² ......................................... H03G 3/00
[58] Field of Search ...... 179/1 P, 1 VL, 1 MN, 1 N, 179/1 A; 330/51, 29, 144

[56] References Cited
UNITED STATES PATENTS

| | | |
|---|---|---|
| 2,503,391 | 4/1950 | Kannenberg ........................ 179/1 P |
| 2,564,437 | 8/1951 | Kannenberg ........................ 179/1 P |
| 2,575,990 | 11/1951 | Augustadt ........................... 179/1 P |
| 2,616,971 | 11/1952 | Kannenberg ........................ 179/1 P |
| 2,668,874 | 2/1954 | Augustadt ........................... 179/1 P |
| 3,296,373 | 1/1967 | Suganuma ........................... 179/1 P |
| 3,410,958 | 11/1968 | Cohen ................................. 179/1 P |
| 3,444,323 | 5/1969 | Nagashima et al. ............... 179/1 VL |

*Primary Examiner*—Douglas W. Olms
*Attorney, Agent, or Firm*—Laurence R. Brown

[57] ABSTRACT

An audio amplifier system is provided comprising a variable gain amplifier adapted to receive an input signal, means for detecting periods when the input signal falls below a predetermined level, and sound transducer means arranged to provide a signal proportional to the sound level in the area or part thereof covered by the system for controlling the gain of the amplifier. An inhibitor is provided which is arranged to be controlled by the detecting means so as to prevent any change of the gain of the variable gain amplifier except during periods when the input signal falls below the said predetermined level.

11 Claims, 5 Drawing Figures

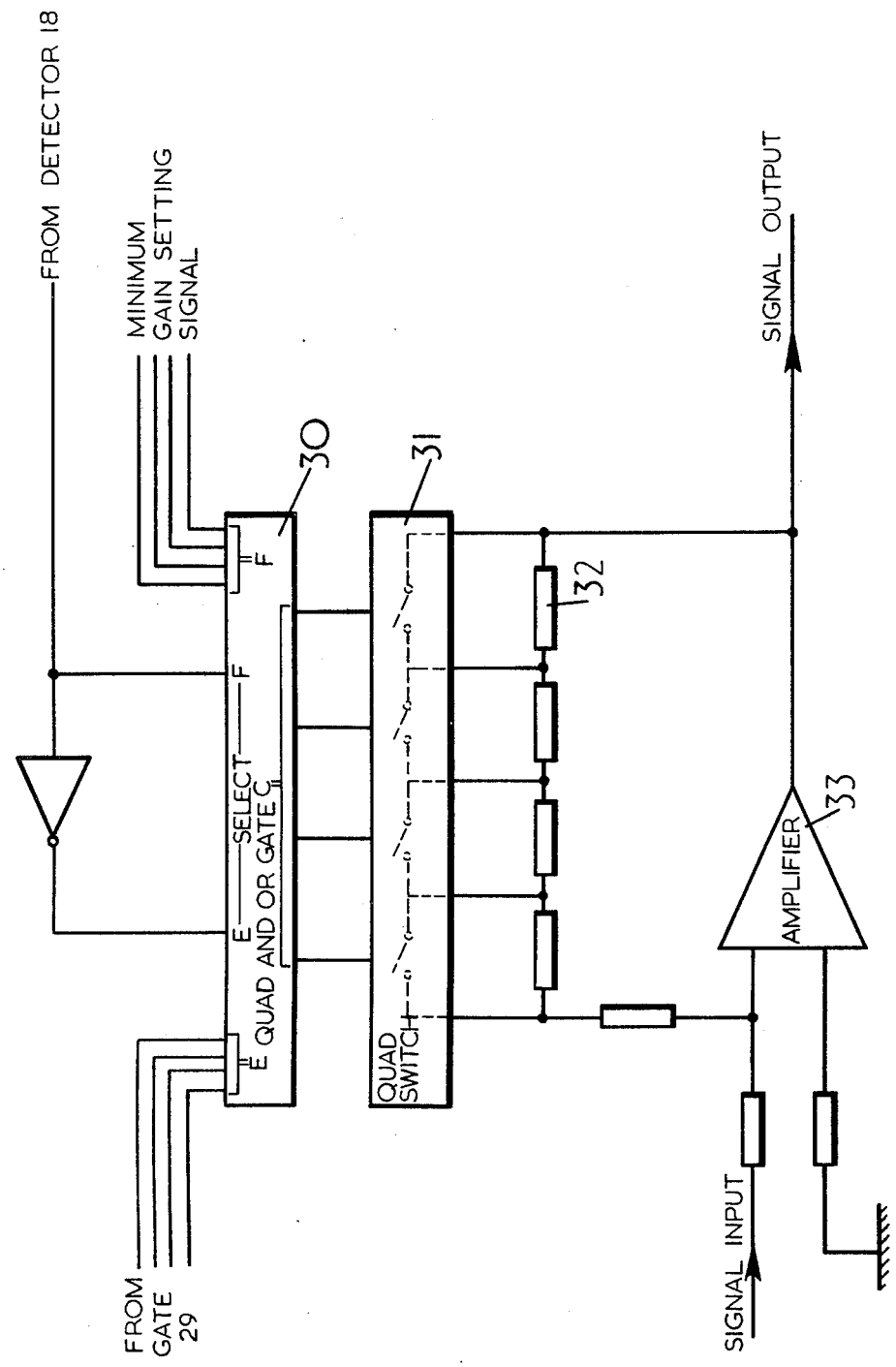

AUDIO AMPLIFIER SYSTEMS

This application is a continuation-in-part application on U.S. Ser. No. 455,373, filed Mar. 27, 1974.

This invention relates to audio amplifier systems in which the gain of the amplifier is controlled to compensate for changes in level of the ambient background noise level. In such systems it is required that the sound level of the reproduced speech or music should be higher in noisy locations and lower in quieter locations.

Hitherto, the gain of the amplifier has been controlled by a signal from a microphone placed in the area to be covered.

The microphone picked up both the general background noise present and the sound generated by the amplifier system and in order to derive a signal that was proportional to the noise level, for control purposes, a signal was taken directly from the amplifier, adjusted to the correct level, and subtracted from the combined signal obtained from the monitor microphone. Theoretically, the resultant signal was a signal whose amplitude varied with the general noise level in the premises covered by the installation. However, in practice there was the disadvantage that if the 'signal only' and 'signal pulse noise' channels were not correctly set up and perfectly balanced there was a tendency for the system to become unstable with the result that the sound output became excessively loud when an increase in noise level occurred or the sound was turned off by a reduction in the noise level.

An object of the present invention is to provide an improved amplifier system in which this disadvantage is mitigated.

According to the invention, there is provided an audio amplifier system including a variable gain amplifier adapted to receive an input signal, means for detecting periods when the input signal falls below a predetermined level, sound transducer means arranged to provide a signal proportional to the ambient noise level in the area or a part thereof covered by the system for controlling the gain of the amplifier, and inhibitor means controlled by the detecting means to prevent the change of the gain of the variable gain amplifier except during periods when the input signal falls below the said predetermined level.

Preferably the ambient noise level signal is passed to a store during each of said periods and stored until the next said period. The amplifier gain may then be controlled according to the stored value. Conveniently, the ambient noise level signal is converted to digital form before being stored in a digital store.

An embodiment of the invention will now be described, by way of example, with reference to the accompanying drawings, in which:

FIG. 5 shows a variable gain amplifier which may be incorporated in the system of FIG. 1.

Figure 1:
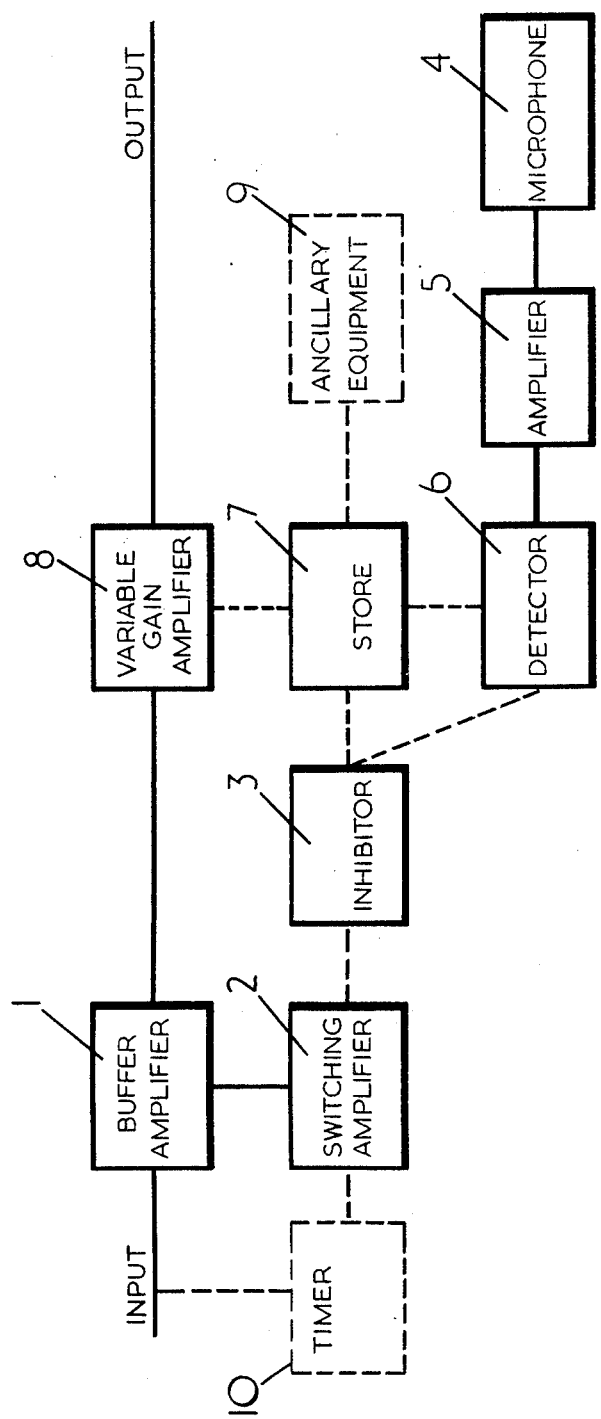
FIG. 1 is a block schematic diagram of an amplifier system according to the invention.

Referring to FIG. 1, an input signal, which represents speech, music, warning signals and the like, is fed to a buffer amplifier 1 which is included to prevent the system loading the signal source and also to isolate the control circuitry from the signal path. The signal from buffer amplifier 1 is fed to a variable gain amplifier 8 and also to a switching amplifier 2 which detects periods when the input signal falls below a predetermined level. This level is set to correspond with a level at which the sound level from loudspeakers fed from the amplifer 8 does not add significantly to the ambient noise level. This level may be set by means of an external control adjusted by an operator, or in a more sophisticated installation the level may be set at a signal level a given amount below a peak signal level, which peak level is determined automatically. Switching amplifier 2 provides a gating signal to an inhibitor 3, the action of which will be discussed later.

In the area to be covered by the loudspeakers there is provided a microphone 4 which provides an electrical signal proportional to the sound pressure level present. Any transducer which will provide such a signal will suffice, for example a loudspeaker similar to the ones used for radiating sound may be used as a microphone thus enabling common parts to be used. The microphone should be placed where it can respond to the general noise level of the area to be covered and care should be taken to ensure that nothing can be placed near it, after installation, to mask the background noise. The output signal from microphone 4 is amplified in an amplifier 5 which has a handling capacity such that it does not overload in the presence of the combined speech or music and the ambient noise signal.

The amplified signal is fed to a detector 6 and has a value which represents the total sound during speech or music and the noise level during quiet periods in between the music or speech. A signal from inhibitor 3 controls the output of detector 6 so that an output signal is passed to a store 7 only during quiet periods, i.e. when switching amplifier 2 detects that the signal at buffer amplifier 1 is below the predetermined level. Detector 6 is arranged to follow rapidly the signal from amplifier 5 so that the measure of the background noise level is obtained during a quiet period. If the time constant remains short during the sensing time any sudden change in noise level, e.g. a dropped metallic object, will cause an incorrect level to be detected. Preferably, therefore, the time constant of the detector 6 is increased during the quiet periods.

Since there may be long intervals between quiet periods, for example as long as 5 – 10 minutes if music is being played, it is necessary to store the detector output in order that the gain of variable gain amplifier 8 does not change during such an interval. As is apparent the gain of amplifier 8 is controlled according to the level stored in store 7. The design of the store depends on the degree of control required. A simple arrangement is to divide the noise level into a number of discrete levels of say 3dB so that it will be necessary to store only a limited number of gain settings. In a more sophisticated arrangement there may be provided an analogue to digital converter which will supply a coded output giving an indication of the detector 6 output.

Depending upon the number of digits used the number of quantizing levels can be made large, e.g. with 10 digits of a binary code the detector output can be split into 1,024 levels, and hence each level represents a small change in ambient noise. This coded signal can, if it is desired, be processed by normal digital techniques, e.g. the threshold of the system can be varied by subtracting a fixed number from the number held in the store. Further refinements may include the variation of the amplifier gain to reduce the sound output at night or to increase the amplitude for announcements of particular importance. In both these cases this is accomplished by processing the digital information held in the store, in the former instance under the control of a time clock and in the latter manually by a supervisory operator. Again by using what is in effect computer techniques it is possible to instruct the unit not to increase the gain above a level which will result in the public address system being overloaded or where the sound level would cause annoyance. The information in the store, after any processing, is used to control the gain of variable gain amplifier 8 under instruction from inhibitor 3.

Variable gain amplifier 8 provides compensation for changes in the level of the ambient background noise so that the music or speech amplification is increased in noisy backgrounds and is decreased in quiet backgrounds. Amplifier 8 includes a variable gain element which is controlled by the signal contained in store 7. Various variable gain elements may be used but suitable elements may include the source to drain resistance of a field effect transistor or the resistance of a photoconductive cell.

Although it has been assumed that an increase or decrease in ambient noise will result in a proportional change in amplifier gain it is possible for a change in noise level to have a greater (or lesser) effect at quieter noise levels merely by altering the characteristics of the detector.

The output of the detector or store may be fed to ancillary equipment 9 such as a recorder for future analysis. Thus in a shop, by study of a record of the noise level one could determine the times when extra staff are needed to deal with popular shopping periods, or again on the basis that more people make more noise the noise level signal could be used to control an air conditioning system.

The output could also be used to initiate warning devices whenever the ambient sound level reaches a predetermined (or dangerous) level.

A further variation is to provide a timer 10 in addition to the switching amplifier 2 whereby at predetermined intervals the timer mutes the input signal for a sampling period. During this period the switching amplifier 2 will detect that the signal has fallen below the predetermined level and the system will behave as previously described. It is arranged that each time the switching amplifier detects that the signal is below the predetermined level it resets the timer; thus the timer will operate only after a preset period of uninterrupted signal. Such a system ensures that the ambient noise is monitored at intervals not exceeding a given length, but with the minimum of unnatural breaks. Arrangements are made to prevent the timer operating if essential announcements are being made.

Particular circuits will now be described for an embodiment of the invention in which the detector provides an analogue voltage which is converted to a 4 bit digital code, each grouping of four digits corresponding to one of sixteen different levels. The control range may of course be split into less than or more than sixteen quantized levels if an appropriate number of bits are used.

Figure 2:
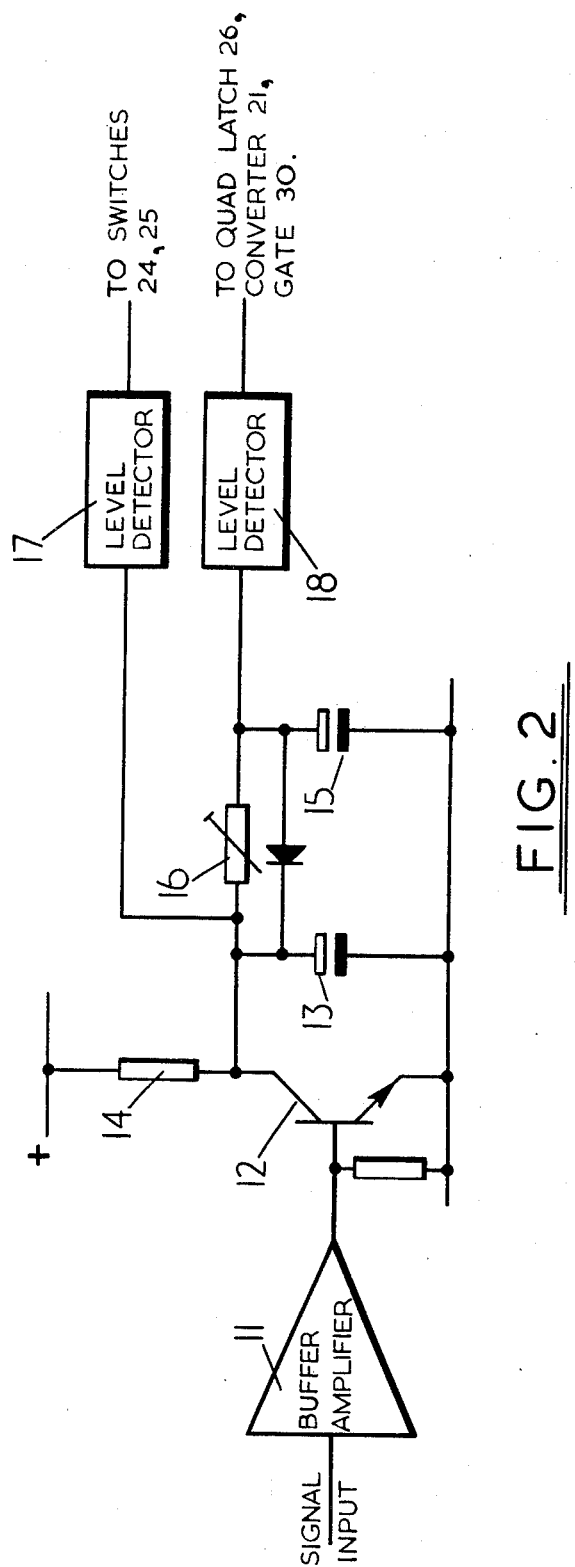
FIG. 2 shows switching amplifier and inhibitor circuits which may be incorporated in the system of FIG. 1.

Referring to FIG. 2 which shows switching amplifier and inhibitor circuits, an audio signal, e.g. music, is fed to a buffer amplifier 11 which isolates subsequent circuits from the audio channel and provides some amplification. This amplification is adjustable by a preset control and determines the audio signal level at which switching takes place. The amplified signal is applied to the base of a transistor 12 which is arranged to be non-conductive if the amplified signal falls below a predetermined level. When the transistor 12 is non-conductive, its collector will be at the supply potential and a capacitor 13 will charge via a resistor 14 and a capacitor 15 will charge via the resistor 14 and a variable resistor 16. Capacitor 13 charges more quickly than the capacitor 15 because of the presence of the variable resistor 16. When transistor 12 conducts, the capacitors 13 and 15 discharge therethrough. Two DC level detectors 17 and 18 detect the voltage level on the capacitors 13 and 15 respectively and provide an output signal when the voltage level exceeds a certain value. These outputs are separated by a time determined by the time constants of the charging circuits. The output of detector 17 is applied to an ambient noise level detector (FIG. 3) and the output of detector 18 is applied to an analogue to digital converter (FIG. 3) a store (FIG. 4), and a variable gain amplifier (FIG. 5).

Figure 3:
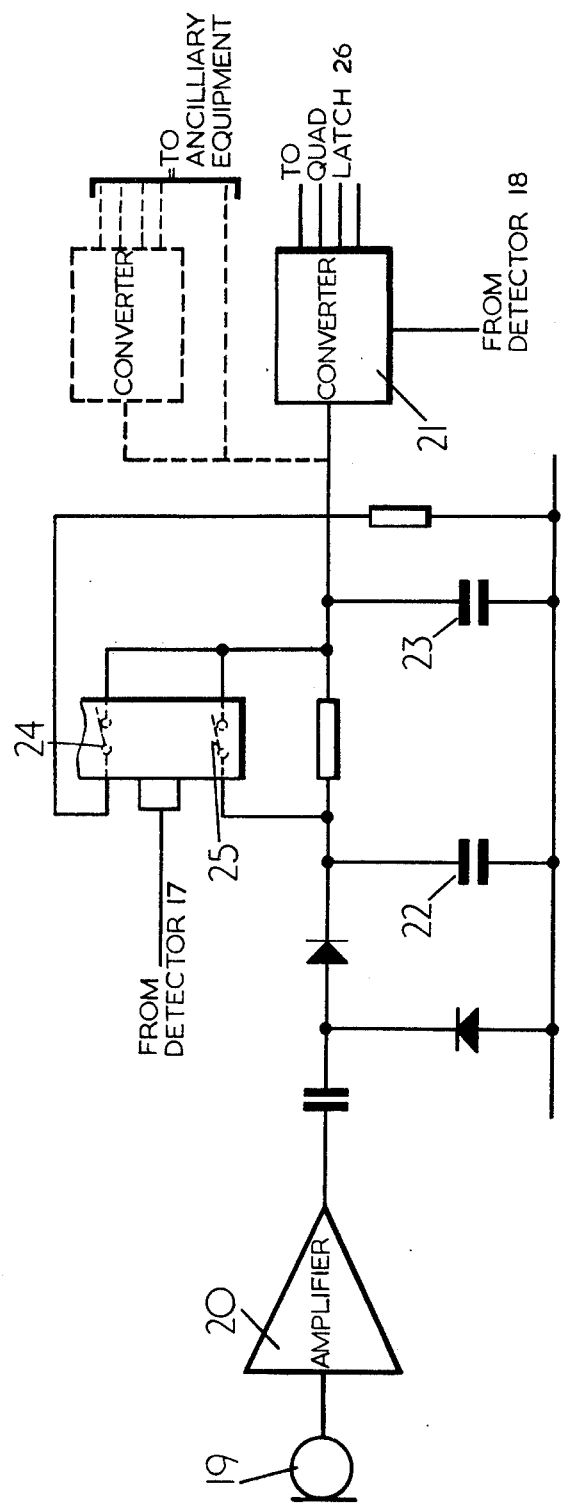
FIG. 3 shows an ambient noise level detector which may be incorporated in the systems of FIG. 1.

Referring to FIG. 3, a signal from a microphone 19 located in the area covered by the system is amplified to a suitable level by amplifier 20 before being fed to a rectifying circuit which provides an analogue-to-ditigal convertor 21 with a D. C. voltage proportional to the noise level as perceived by the microphone 19. The rectifying circuit includes capacitors 22, 23 and a pair of switches 24, 25 controlled by the output of detector 17 (FIG. 2). When the detector 17 provides an output indicative of a signal input to the buffer amplifier 11 above the predetermined level, the switches 24, 25, which may be solid state switches, are closed. The time constant of the rectifying circuit is small, hence the voltage on the capacitors 22, 23 will follow rapidly any variations of noise (which will include the audio signal fed to the area) picked up by the microphone 19. When the level of audio signal has been below the predetermined level for sufficient time for the level detector 17 to operate, the output from the detector 17 will cause the switches 24, 25 to open, increasing the charge time of the capacitors 22, 23 so that the voltage on these capacitors will vary only slowly in response to changes in noise level. Thus, any sudden short duration variations will be averaged out. The analogue-to-digital convertor 21 provides a 4 bit digitally coded signal corresponding to the analogue voltage present at its input. This convertor 21 is arranged to provide an output that changes, if a change is required, by one level at a time at a slow predetermined rate. The output of the convertor is prevented from changing during periods when a signal is present in the amplifier chain by means of the control signal from the detector 18. This digital output signal of the convertor 21 which corresponds to the noise level is fed to the store (FIG. 4) and if desired may also be fed to external recording or auxilliary equipment. The analogue voltage on the input of convertor 21 corresponding to the noise and signal level may be taken out for example for recording purposes or the control of ancilliary equipment.

Figure 4:
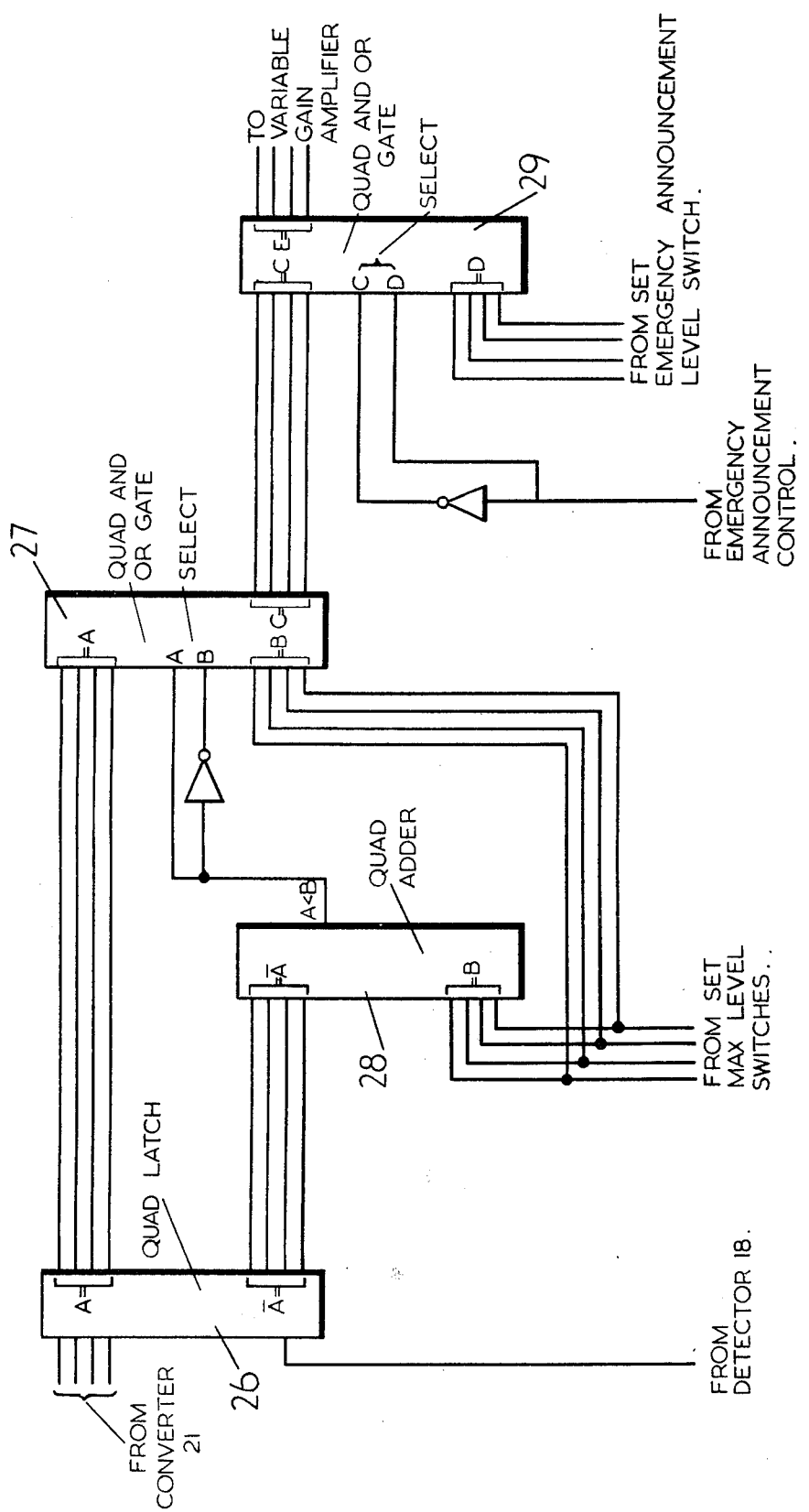
FIG. 4 shows a store and processors which may be incorporated in the system of FIG. 1.

Referring now to FIG. 4, the coded signal from the analogue to digital convertor 21 (FIG. 3) is applied to a store in the form of a quad latch 26 which provides an output (A) which follows the input whenever a control signal from detector 18 (FIG. 2) is present but which provides an output which remains constant whenever the control signal is absent, the output during the period from "control signal absent" to "control signal present" being equivalent to the input that was present immediately before the beginning of the period. Thus the output will follow the input whenever no audio signal is present but will latch to a steady value whenever the audio signal is present. Since this output is to be used to control the gain of an amplifier it can be seen that the gain of the amplifier (it can be seen that the gain of the amplifier) can only change during periods when no audio signal is present. As the convertor 21 can only change levels at a slow rate, the gain of the amplifier is not greatly affected by for example short pauses in speech or pauses between titles in a music programme. The output (A) of latch 26 is taken to a quad AND-OR gate 27 and the complement (A) of the output (A) is taken to a quad Adder 28. A signal (B), in a digitally coded form, is fed from a "set maximum level" switch or switches (not shown) to both the quad Adder 28 and the quad AND-OR gate 27. The "set maximum level" switch or switches enable different maxmimum levels to be selected for example for day-time and night-time operation. The signal (B) is the digital code corresponding to the gain setting providing the loudest sound level that is required. The signal (B) and the signal (A) are added in the quad 28, which in effect is the same as subtracting the signal (A) from the signal (B), and an output is provided from the Adder 28 whenever the signal (A) corresponds to a level lower than that of signal (B). This output and its complement are applied to the control terminals of the quad AND-OR gate 27. The AND-OR gate 27 is a circuit element which provides an output identical to one of either of two inputs under the action of two select signals. In the circuit described signal A is selected whenever it corresponds to a level lower than that of signal B otherwise signal B is selected as the output (B). Thus the output (C) is a gain control signal which varies under the control of the ambient noise level until it reaches a preset maximum level after which it cannot increase even though the ambient noise becomes louder. The signal (C) is fed to a further quad AND-OR gate 29 together with a signal (D) from a "set emergency announcement level" switch (not shown). Signal (D) is the digital code corresponding to the gain required to provide the desired loudness for emergency announcements. The output (E) of gate 29 will be equivalent to either signal (C) or signal (D) depending upon the control signal fed to the selection terminals of the gate. Normally signal (C) will be selected but whenever an emergency announcement is to be made signal (D) will be selected, overriding the ambient noise controlled gain signal. The output (E) from the gate 29 is fed to a variable gain amplifier (FIG. 5).

An alternative method of providing for maximum level and emergency level processing using analogue techniques is to provide electronic switching at the output of the ambient noise detector which prevents the D.C. voltage rising above a preset (adjustable) level for maximum level limiting and permits the switching in of another preset D.C. voltage for emergency announcement level setting.

Referring now to FIG. 5, a variable gain amplifier is illustrated the gain control element of which is connected to receive the digital signal (E) from the gate 29. The signal (E) is applied to a quad AND-OR gate 30 which may select a minimum gain setting (F) for the amplifier during sensing periods under the control of the output of detector 18 (FIG. 2). The 4 bits of the digital output signal (G) of the gate 30 are used to control electronic switches 31 (such as field effect transistors) which short out resistors 32 in the feedback chain of an operational amplifier 33. By suitable selection of the resistor values and weighting of the code elements, the gain of the amplifier 33 may be made to vary over the desired range in suitable steps. Alternatively, the digital signal may be made to control switches shorting out resistors placed in one leg of an input attenuator of the amplifier. A further variant is for the digital signal to control the current through a lamp which in turn controls the resistance of a photo conductive cell forming part of an input attenuator.

What is claimed is:

1. An audio amplifier system including a variable gain amplifier adapted to receive an input signal, means for detecting periods when the input signal falls below a predetermined level, sound transducer means arranged to provide a signal proportional to the ambient noise level in the area or a part thereof covered by the system for therewith controlling the gain of the amplifier, and inhibitor means controlled by said detecting means to prevent the change of the gain of said variable gain amplifier except during periods when the input signal falls below said predetermined level, wherein the sound transducer means comprises signal detecting means whose response time is short at the beginning of each said period and increases for the remainder thereof, and wherein the said latter signal detecting means comprises first and second capacitors arranged to be charged when the input signal falls below the said predetermined level and first and second level detectors arranged to detect when the voltage across the respective capacitors rises above a predetermined voltage level, the first capacitor charging at a faster rate than the second, and the first level detector controlling the response time of the signal detector of the sound transducer means.

2. An audio amplifier system according to claim 1, wherein the sound transducer means includes a rectifier to which the ambient noise level signal is applied and a filter network through which the rectified ambient noise level signal is passed, said filter network comprising two capacitors connected in shunt with said rectified signal and between them a resistor connected in series with said rectified signal and, connected in shunt with said resistor, a normally closed switch arranged to be controlled by the first level detector and arranged to open when the voltage across the first capacitor of the detector means rises above the predetermined voltage.

3. An audio amplifier system according to claim 2, wherein a convertor is provided to convert the analogue sound level signal provided across the capacitance of the sound transducer means to digital form for application to a store.

4. An audio amplifier system according to claim 3, wherein the convertor is arranged to change its digital output in response to changes in its analogue input by one level at a time at a predetermined rate.

5. An audio amplifier system according to claim 3, wherein the convertor is controlled by the second level detector so that its output is maintained constant when the voltage across the second capacitor is below the predetermined voltage level.

6. An audio amplifier system according to claim 4, wherein the store comprises a latch connected to the output of the convertor and controlled by the second detector so that its output follows its input only when the voltage detected is above the said predetermined voltage level.

7. An audio amplifier system according to claim 6, comprising an AND-OR gate arranged to receive the output of the latch and a digital signal indicative of the maximum desired operating level of the system, and an adder arranged to receive the maximum level signal and the complement of the output of the latch, the output of the adder being applied to the control terminals of the gate to cause the gate to provide an output which follows that of the two inputs thereto, which is indicative of the lower level.

8. An audio amplifier system according to claim 7, wherein the output of the gate is applied to a second AND-OR gate which receives a further input indicative of a fixed high level, and the further gate is controlled to select one or other of its two inputs by a control signal from a manually operable switch.

9. An audio amplifier system according to claim 8, wherein the output of the second gate is applied to a third AND-OR gate which receives a further input indicative of a minimum level, the third gate being controlled by the output of the second detector of the detecting means so that its output follows the minimum level input when the audio signal drops below the said predetermined level.

10. An audio amplifier system according to claim 3, wherein the variable gain amplifier comprises an amplifier having a feed-back loop including a plurality of series arranged resistors, and the signal passed from the store to the variable gain amplifier is arranged to control switches which short out respective ones of the resistors.

11. An audio amplifier systems according to claim 3, comprising a time clock arranged to control means operative on the store for adjusting the output of the variable gain amplifier during selected periods.

* * * * *